United States Patent
Hosono et al.

(10) Patent No.: US 6,404,274 B1
(45) Date of Patent: Jun. 11, 2002

(54) INTERNAL VOLTAGE GENERATING CIRCUIT CAPABLE OF GENERATING VARIABLE MULTI-LEVEL VOLTAGES

(75) Inventors: Koji Hosono, Yokohama; Yasuo Itoh, Kawasaki; Ken Takeuchi, Tokyo, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/289,413

(22) Filed: Apr. 9, 1999

(30) Foreign Application Priority Data

Apr. 9, 1998 (JP) .......................................... 10-097410

(51) Int. Cl.[7] .............................................. G05F 1/10
(52) U.S. Cl. ...................................... 327/538; 327/536
(58) Field of Search .................................. 327/536, 538, 327/308, 306, 540; 341/144, 154

(56) References Cited

U.S. PATENT DOCUMENTS

| | | | | |
|---|---|---|---|---|
| 5,282,685 A | * | 2/1994 | Koegler | 374/172 |
| 5,388,084 A | * | 2/1995 | Itoh et al. | 327/538 |
| 6,002,354 A | * | 12/1999 | Itoh et al. | 341/144 |
| 6,107,862 A | * | 8/2000 | Makainakano et al. | 327/536 |

FOREIGN PATENT DOCUMENTS

JP  8-46515  2/1996  ............ H03M/1/78

* cited by examiner

*Primary Examiner*—Dinh T. Le
(74) *Attorney, Agent, or Firm*—Hogan & Hartson, L.L.P.

(57) ABSTRACT

There is provided an internal voltage generating circuit for outputting positive multi-level voltages by using a current addition type D/A conversion circuit, and suppressing increase of the pattern area of a resistor network even if the number of bits of a digital input increases. This circuit includes a load resistor element having one terminal connected to the output node of a voltage generating circuit, a first voltage setting circuit which is connected to a first node to which the other terminal of the load resistor element is connected and controls the magnitude of an input current from the load resistor element by controlling an equivalent resistor in accordance with digital data, a second voltage setting circuit which is connected to the first node and into which a predetermined current flows from the load resistor element, a potential comparison circuit for detecting a potential at the first node by comparing the potential at the first node with a reference potential, and a voltage control circuit for setting the potential at the first node to become equal to the reference potential by substantially controlling the voltage generating circuit in accordance with an output from the circuit.

10 Claims, 6 Drawing Sheets

INTERNAL VOLTAGE GENERATING CIRCUIT CAPABLE OF GENERATING VARIABLE MULTI-LEVEL VOLTAGES

BACKGROUND OF THE INVENTION

The present invention relates to a chip internal voltage generating circuit for generating internal voltages for a semiconductor integrated circuit and a semiconductor memory using the internal voltage generating circuit and, more particularly, to a voltage setting circuit for setting a plurality of variable potentials and a semiconductor memory using the voltage setting circuit, which are used, e.g., for a data write/erase multi-level voltage generating circuit for a nonvolatile semiconductor memory.

A single power supply has recently been employed in a semiconductor integrated circuit incorporating an electrically programmable and erasable nonvolatile memory, e.g., an EEPROM or flash memory. When a single power supply is used, an internal voltage generating circuit provided in a chip generates a high voltage required to write or erase data.

Such an internal voltage generating circuit includes a charge pump circuit which generates a high voltage from the an externally applied power supply voltage and a voltage limiter circuit for adjusting the output voltage from the charge pump circuit to a desired voltage value (internal voltage).

In consideration of variations in characteristics of wafers or chips, it is essential to add a trimming circuit to the voltage limiter circuit. In some case, a generated internal voltage may be intentionally stepped up to be used for write or erase operation.

Under the circumstances, it is desired that the voltage range and the step-width of the above voltage limiter circuit can freely be designed in accordance with the application purpose. It is therefore preferable that the above voltage limiter circuit allows arbitrary setting of a set voltage range and the width of voltage steps.

FIG. 7 shows an equivalent circuit of a conventional internal voltage generating circuit for generating internal voltages, such as write and erase voltages in an EEPROM or flash memory.

Referring to FIG. 7, a voltage limiter circuit is connected to an output node 10 of a charge pump circuit (CP) 70 generating a given internal voltage. In this voltage limiter circuit, a load resistor RL having a constant resistance is connected in series to an equivalent resistor R1' of a trimming circuit 20 for setting the voltage value of output node 10. Resistors RL and R1' are arranged between the output node 10 of the charge pump circuit 70 and a ground potential Vss.

A comparison output VXXFLG is generated by voltage comparing circuit 13 comparing the potential at a connection node N1 between the resistor elements RL and R1' with a reference voltage Vref. This comparison output VXXFLG is fed back to the charge pump circuit 70 through a CP control circuit 17 to control the boosting operation of the charge pump circuit 70 so as to make the potential at the connection node N1 equal to the reference voltage Vref. As a result, an output voltage VXX from the output node 10 is controlled to be constant.

FIG. 8 shows an equivalent circuit of a resistance-type potential dividing D/A conversion circuit, which is a conventional arrangement of trimming circuit 20 as shown in FIG. 7.

This trimming circuit comprises division resistors R1-1, R1-2, . . . , R1-m connected in series, MOS transistors T1, T2, . . . , Tm serving as switches, each having one terminal connected to corresponding one of the resistors at one terminal closer to the ground potential and having the other terminal commonly connected to the ground potential Vss, and a decoder circuit 21 for decoding control data B1, B2, . . . , Bn (n-bit data) to supply control signals D1, D2, . . . , Dm for selectively turning on one of the MOS transistors.

The output voltage VXX at the output node 10 of the charge pump circuit 70 in FIG. 7 can be expressed by:

$$VXX = Vref + (Vref \cdot RL)/R1' \qquad (1)$$

As is obvious from equation (1) above, the output voltage VXX can be adjusted by adjusting the resistance value of the equivalent resistor element R1' in the trimming circuit 20 thereby to change the potential at a connection node N10.

In the circuit arrangements shown in FIGS. 7 and 8, both the absolute value of the output voltage VXX and a voltage step width are determined by the load-resistor element RL and the resistor element R1' subjected to trimming. In other words, when the resistance values of the resistor element R1' and the load resistor element RL change, both the value of the output voltage VXX and voltage step width may vary.

If, therefore, the range of the output voltage VXX required is changed, the value of the equivalent resistor element R1' of the trimming circuit 20 must be determined again to keep the voltage step width unchanged (As for the circuit of FIG. 8, it will be necessary to set again the resistance value of each of the resistors R1-1 to R1-m.) The same problem occurs in the case that only the voltage step width is changed. Further, The same applies to a processed chip. For example, when the resistance values of the resistor elements R1' and RL are changed by adding or removing interconnections (resistance components) by FIB process, there occurs a problem such that the voltage step as well as the range of the output voltage width is change.

More specifically, in the conventional internal voltage generating circuit shown in FIGS. 7 and 8, the degree of freedom in determining a set voltage range, the minimum set voltage, and the number of voltage steps is low. When the minimum set voltage changes, the voltage step width also changes. In addition, since decoder circuits, each identical to the decoder circuit 21 for generating control signals, are required in accordance with the number of set voltages, the arrangement is complicated, and the number of elements used increases.

For example, to make the voltage limiter circuit generate set voltages corresponding to 16 steps, the trimming circuit 20 requires 16 pairs of division resistors R1-I (I=1, 2, . . . , m). and MOS transistors Ti, 16 interconnections for control signals Di to be input to the gates of the MOS transistors Ti, and 16 4-input decoder circuits each serving as the decoder circuit 21 for decoding 4-bit digital data.

In general, if a trimming step count is $2^N$, $2^N$ division resistors and $2^N$ N-input decoders corresponding to N-bit digital inputs are required.

As the value of N increases, the number of elements such as the decoder circuits 21 and division resistors abruptly increases. As a consequence, the pattern area of the trimming circuit 20 increases, resulting in difficulty in circuit design. In addition, the degree of freedom in pattern change is low with respect to manufacturing variations in resistance value. This makes it more difficult to make a design change for the adjustment of resistance values.

A conventional multi-level high power generating circuit for an EEPROM to which the internal voltage generating circuit is applied will be described next.

Among EEPROMs, a NAND cell type flash memory using an array of cell units (NAND cells) each consisting of a plurality of series-connected memory cells is known as a memory that allows high integration and batch erase operation.

Each memory cell of a NAND cell type flash memory has a MOSFET structure in which a floating gate (charge storage layer) and a control gate are stacked, through an insulating film, on a semiconductor substrate on which source and drain regions are formed. A NAND cell is formed by connecting a plurality of memory cells in series with each other with adjacent memory cells sharing sources and drains. Such NAND cells are arranged in the form of a matrix to form one memory cell array.

In this case, the respective bit lines extend in the column direction, and the drain on one end side of each of NAND cells arranged side by side in the column direction of the memory cell array is commonly connected to the bit lines through a corresponding selection gate transistor. The source on the other end side of each NAND cell is connected to a common source line through a corresponding selection gate transistor. The control gates of the respective cell transistors are continuously arranged in the row direction to serve as control gate lines (word lines), and the gates of the respective selection gate transistors are continuously arranged in the row direction to serve as selection gate lines.

Such a NAND cell type flash memory is disclosed in K. D. Suh et al., "A3.3V 32 Mb NAND Flash Memory with Incremental Step Pulse Programming Scheme," IEEE J. Solid-State Circuits, vol. 30, No. 11, pp. 1149–1156, November 1995 and the like.

FIG. 7 in the above reference shows circuits having arrangements like those shown in FIG. 7 as a Vpgm generating circuit (step-up circuit) for generating a write voltage Vpgm to be applied to a word line and the like in data write or erase operation and a voltage limiter circuit.

Referring to FIG. 9A, the voltage limiter circuit connected between the output node (Vpgm node) of a Vpgm charge pump circuit 100 and a ground potential Vss is comprised of a voltage generating circuit section, a voltage comparison circuit section, and the like.

The above voltage generating circuit section is made up of a plurality of voltage dividing resistors Ri (R12 to R1 in this case) connected in series, one NMOS transistor $Q_{n0}$, and a plurality of switch selection NMOS transistors $Q_{ni}$ ($Q_{n1}$ to $Q_{n10}$ in this case) each having one terminal connected to one terminal each of some resistors (R10 to R1 in this case) and the other terminal commonly connected.

The gates of the NMOS transistors $Q_{n1}$ to $Q_{n10}$ respectively receive corresponding control signals TRMI (TRM1 to TRM10 in this case). The gate of the NMOS transistor $Q_{n0}$ receives a control signal PGM.

The above voltage comparison circuit section is a differential operational amplification circuit made up of PMOS transistors $Q_{p1}$ and $Q_{p2}$ and NMOS transistors $Q_{n21}$, $Q_{n22}$ and $Q_{n23}$. The voltage at the connection node between the resistors R11 and R12 of the voltage generating circuit section is applied to the gate of the NMOS transistor $Q_{n22}$ which is one of the driving MOS transistors. The reference voltage Ref generated by a reference voltage generating circuit (not shown) is applied to the gate of the NMOS transistor $Q_{n21}$ which is the other driving MOS transistor. The reference voltage Ref is then compared with the potential at the connection node between the resistors R11 and R12.

The above control signal PGM is supplied to the gate of the NMOS transistor $Q_{n23}$ in the voltage comparison circuit section. When this signal PGM is set at "H" level to turn on the NMOS transistor $Q_{n23}$ the voltage comparison circuit performs comparing operation.

The signal from the output node of the voltage comparison circuit section and the control signal PGM are input to an 2-input NAND circuit 101. The output from the NAND circuit 101 is input to a clock output circuit 102. The output from the NAND circuit 101, input to the clock output circuit 102, is controlled by clock signals φp and $\overline{φp}$ and output as output signals φ vpgm and $\overline{φvpgm}$.

In the voltage limiter circuit having the above arrangement, it is checked whether the potential at the connection node between the resistors R11 and R12 is higher or lower than the reference voltage Ref. In accordance with the determination result, the output signals φ vpgm and $\overline{φvpgm}$ are activated, and the operation of the Vpgm charge pump circuit 100 is controlled to be inactivated/activated. As a result, the Vpgm node is kept at a nearly constant voltage (limit voltage).

The potential difference between the potential at the Vpgm node and the ground potential Vss is divided into a plurality of potential difference outputs by the resistors R12 to R1. These potential difference outputs are controlled such that one of the switch selection transistors $Q_{n1}$ to $Q_{n10}$ is turned on in accordance with the control signals TRM1 to TRM10. The limit voltage setting values can therefore be adjusted by changing the settings of the control signals TRM1 to TRM10.

More specifically, as shown in FIG. 9B, when the transistor $Q_{n1}$ is selected, a voltage of 16.0V is generated. When the transistor $Q_{n2}$ is selected, a voltage of 16.5V is generated. When the transistor $Q_{n10}$ is selected, a voltage of 20.0V is generated. This circuit can generate different output voltages ranging from 15.5V to 20.0V in steps of 0.5V.

The voltage limiter circuit in FIG. 9A, however, has the following problems.

First, the control signals TRM1 to TRM10 are decoded signals, and one decoder is required for one control signal TRMi. Therefore, as the number of output voltage steps increases, the number of decoders increases, resulting in an increase in pattern area.

In addition, when the set values of output voltages need to be changed in accordance with write/erase characteristics of memory cells, since the degree of freedom in setting output voltages is low, all the resistance values must be changed in some case. When the number of output voltage steps is large, in particular, it is difficult to finely adjust or correct all the resistance values.

As schemes of solving the above problem of an increase in pattern area, several schemes are known, in which signals are directly decoded in an analog fashion by combining resistors such as current addition type D/A conversion circuits, voltage addition type D/A conversion circuits, weighted resistance type D/A conversion circuits, and the like without using any decoders.

Of these circuits, current addition type D/A conversion circuits are used most widely. The operation principle of this scheme is disclosed in, for example, Toshikazu Yoneyama, "Illustration: Introduction to D/A Conversion", OHM-Sha, Ltd., 1993.

As described above, in the voltage limiter circuit of the conventional internal voltage generating circuit, the degree of freedom in determining a set voltage range, the minimum set voltage, and the number of voltage steps is low. If, therefore, the minimum set voltage changes, the number of voltage steps changes. In addition, since the trimming decoder circuit must generate control signals equal in number to set voltages, the arrangement is complicated, and the number of elements used increases.

BRIEF SUMMARY OF THE INVENTION

The present invention has been made to solve the above problems, and has as its object to provide an internal voltage generating circuit which can independently set the minimum set voltage and a voltage step width, shift the set voltage range while keeping the voltage step with constant, and set $2_n$ voltage values by using n control signals without using any trimming decoding circuits.

It is another object of the present invention to provide a semiconductor memory which can relatively easily output positive multi-level voltages between a reference potential and a higher power supply potential by using a current addition type D/A conversion circuit, and suppress an increase in the proportion of the pattern area of a resistor network even if a bit count n of a digital input increases.

According to the present invention, there is provided an internal voltage generating circuit comprising a charge pump circuit, a load resistor element having one terminal connected to an output node of the charge pump circuit, a first voltage setting circuit which is connected to a first node to which the other terminal of the load resistor element is connected and controls a magnitude of an input current from the load resistor element by controlling an equivalent resistor in accordance with digital data, a second voltage setting circuit which is connected to the first node to which the other terminal of the load resistor element is connected and into which a predetermined current flows from the load resistor element, a potential comparison circuit for detecting a potential at the first node by comparing the potential at the first node with a reference potential, and a charge pump control circuit for setting the potential at the first node to become equal to the reference potential by substantially controlling the charge pump circuit in accordance with an output from the potential comparison circuit.

In addition, according to the present invention, there is provided a semiconductor memory comprising an oscillation circuit whose oscillation operation is allowed/inhibited in accordance with an oscillation enable signal, the oscillation circuit being adapted to generate a clock signal having a predetermined period in an oscillation operation state, a charge pump circuit for generating a predetermined high voltage by boosting a power supply voltage in accordance with the clock signal, a load resistor element having one terminal connected to an output node of the charge pump circuit, a first voltage setting circuit which is connected to a first node to which the other terminal of the load resistor element is connected and controls a magnitude of an input current from the load resistor element by controlling an equivalent resistor in accordance with digital data, a second voltage setting circuit which is connected to the first node to which the other terminal of the load resistor element is connected and into which a predetermined current flows from the load resistor element, an operational amplification circuit for comparing a potential at the first node with a predetermined reference potential, and controlling an active/inactive state of an oscillation enable signal from the oscillation circuit in accordance with a comparison result, and a memory cell array constituted by memory cells in/from which data is written/erased by using an output voltage from the charge pump circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described in detail below with reference to the views of the accompanying drawing.

Figure 1:
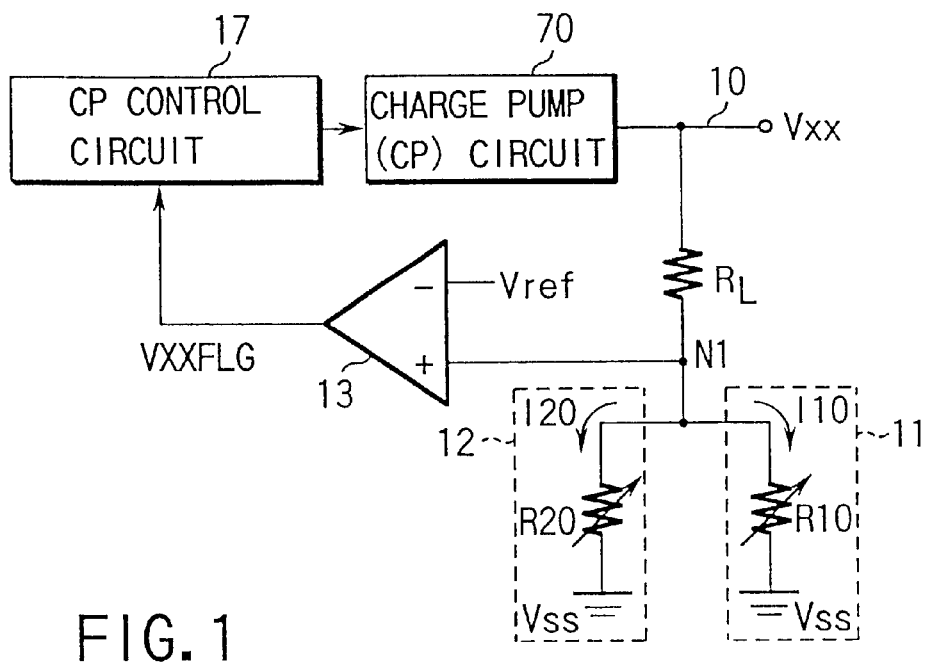
FIG. 1 is an equivalent circuit diagram showing an internal voltage generating circuit according to the first embodiment of the present invention.

FIG. 1 shows an equivalent circuit of an internal voltage generating circuit according to the first embodiment of the present invention.

Figure 7:
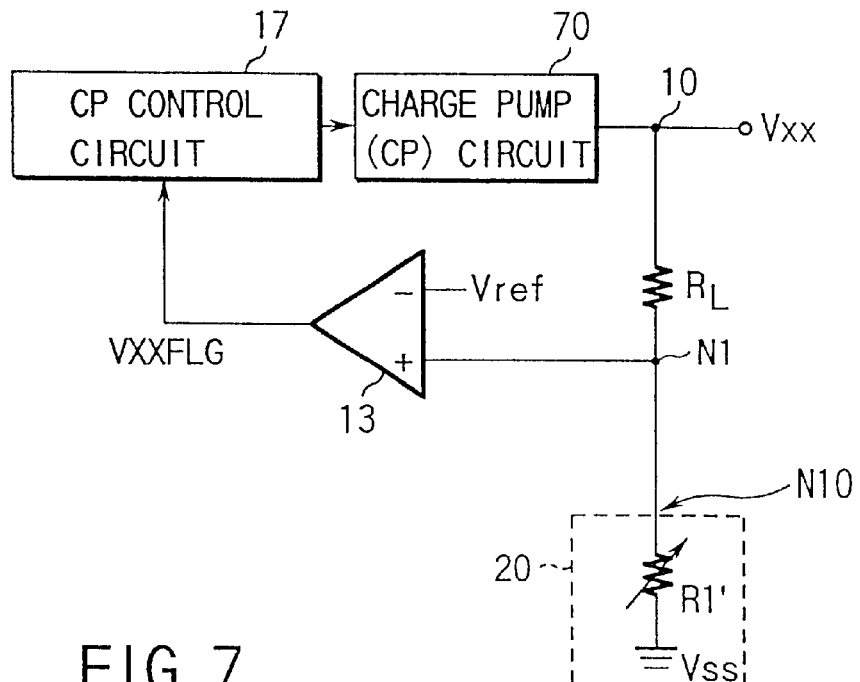
FIG. 7 is an equivalent circuit diagram showing a conventional internal voltage generating circuit.

The internal voltage generating circuit in FIG. 1 differs from the one described with reference to FIG. 7 in a voltage limiter circuit.

More specifically, the voltage limiter circuit connected to an output node 10 of a charge pump circuit 70 for generating a given internal voltage is comprised of a load resistor element RL having one terminal connected to the output node 10 of the charge pump circuit 70 and a trimming circuit connected between a first node N1 on the other terminal side of the load resistor element RL and a ground potential Vss.

The trimming circuit includes first and second voltage setting circuits 11 and 12 connected in parallel. The first voltage setting circuit 11 is formed by using a circuit based on the operation principle of a current addition type D/A converter that controls the magnitude of an input current I10 from the load resistor element RL by controlling an equivalent resistor R10 (first equivalent resistor) in accordance with digital data. A predetermined current from the load resistor element RL flows in the second voltage setting circuit 12. The second voltage setting circuit 12 is designed to control the magnitude of an input current I20 from the load resistor element RL by controlling an equivalent resistor R20 (second equivalent resistor).

An output signal VXXFLG obtained when a potential comparison circuit (operational amplification circuit) 13 compares the potential at the first node N1 and a reference voltage Vref is used to control the boosting operation of the charge pump circuit (CP) 70 through a CP control circuit 17 such that the potential at the first node N1 becomes equal to the reference voltage Vref, thereby obtaining an output voltage VXX.

The comparison/control operation of the potential comparison circuit 13 will be described below.

The potential comparison circuit 13 outputs the output signal VXXFLG that is set at "L"/"H" level depending on whether the potential at the first node N1 is lower/higher than the reference voltage Vref.

When the output voltage VXX has not reached a desired voltage value (when the potential at the first node N1 is lower than the reference voltage Vref), the output signal VXXFLG is set at "L" level, and the CP control circuit 17 causes the charge pump circuit 70 to continue the boosting operation.

In contrast to the above, when the output voltage VXX has reached the desired value (when the potential at the first node N1 is higher than the reference voltage Vref), the output signal VXXFLG is set at "H" level, and the CP control circuit 17 suppresses the boosting operation of the charge pump circuit 70.

In practice, as the CP control circuit 17, a circuit for stopping a charge pumping clock signal or a circuit for rendering the leak path from the VXX terminal to the ground node conductive is used.

The output voltage VXX from the output node 10 of the charge pump circuit 70 in FIG. 1 is represented by:

$$VXX = Vref + (Vref \cdot RL/R10) + (Vref \cdot RL/R20) \quad (2)$$

As is obvious from equation (2), the equivalent resistor R10 of the first voltage setting circuit 11 and the equivalent resistor R20 of the second voltage setting circuit 12 independently contribute to the output voltage VXX.

When the first equivalent resistor R10 of the first voltage setting circuit 11 is infinite, only the current I20 from the second voltage setting circuit 12 flows through the first node N1. Hence, the output voltage VXX from the charge pump circuit 70 becomes the minimum value determined by the current I20. This minimum voltage value is determined by the reference voltage Vref and the second equivalent resistor R20 of the second voltage setting circuit 12. That is, the second equivalent resistor R20 serves to determine the minimum voltage output of the charge pump circuit 70.

In contrast to the above, as the first equivalent resistor R10 of the first voltage setting circuit 11 decreases, the current I10 corresponding to the first equivalent resistor R10 and the current I20 from the second voltage setting circuit 12 flow through the first node N1, and the output voltage VXX from the charge pump circuit 70 increases.

Assume that step voltages as output voltages VXX from the charge pump circuit 70 are to be determined by adjusting the first equivalent resistor R10 in this manner. In this case, even if the minimum voltage output from the charge pump circuit 70 is changed by the second equivalent resistor R20, since the first and second equivalent resistors independently contribute to the output voltage, the output voltage change due to the first equivalent resistor R10, i.e., the voltage step width, does not change.

In the internal voltage generating circuit described above, the second voltage setting circuit 12 for determining the minimum set voltage for rough setting of set voltages operates independently of the first voltage setting circuit 11 for determining a voltage step width for fine setting of set voltages. With this arrangement, the set voltage range can be shifted while the voltage step width of set voltages is kept constant.

<First Embodiment>

Figure 2:
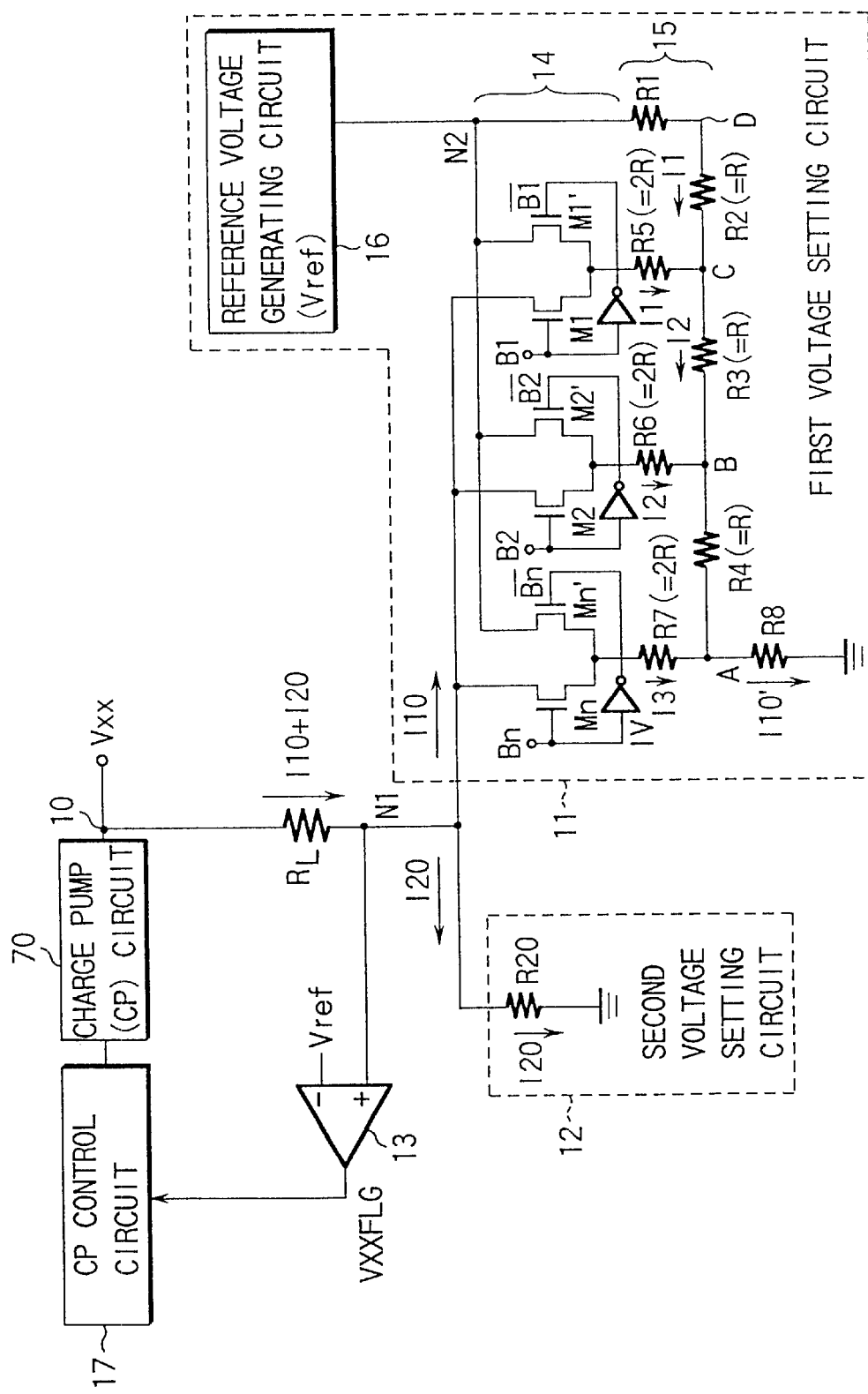
FIG. 2 is a circuit diagram showing the detailed arrangement of the internal voltage generating circuit according to the first embodiment.

FIG. 2 shows an example of the circuit in FIG. 1 in detail.

The first embodiment will be described in detail below with reference to the internal voltage generating circuit in FIG. 2.

Referring to FIG. 2, reference numeral 70 denotes a charge pump circuit; and reference numeral 10 denotes the output node of the charge pump circuit 70. Reference symbol RL denotes a load resistor element; and N1, the first node on the other terminal side of the load resistor element RL. Reference numeral 11 denotes a first voltage setting circuit; and 12, a second voltage setting circuit.

Reference numeral 13 denotes an operational amplifier (operational amplification circuit) for comparing the division potential obtained at the first node N1 with a reference potential Vref, substantially controlling the charge pump circuit 70 in accordance with the comparison output, and performing feedback control to make the potential at the first node N1 equal to the reference potential Vref.

In the first voltage setting circuit 11, a plurality of (n=3 in this case) first switch elements M1 to Mn, each having one terminal commonly connected to the first node N1, are switched/controlled in accordance with bit signals B1 to Bn as digital inputs.

Reference symbols M1' to Mn' denote a plurality of (n) second switch elements, each having one terminal commonly connected to a second node N2, switched/controlled in accordance with bit signals $\overline{B1}$ to $\overline{Bn}$ obtained when the bit signals B1 to Bn as the digital inputs are inverted by inverter circuits IV.

The other terminal of each of the first switch elements M1 to Mn and the other terminal of a corresponding one of the second switch elements M1' to Mn' that are complementarily switched/controlled are commonly connected.

These switch elements M1 to Mn and M1' to Mn' constitute a switching network 14 in which the first and second nodes N1 and N2 are switched/controlled to be selected in accordance with the complementary bit signals B1 to Bn and $\overline{B1}$ to $\overline{Bn}$ as the digital inputs.

Reference numeral 15 denotes a ladder resistor network in which a plurality of (n) 23 first resistor elements R5 to R7, each having one terminal connected to the common connection node between a corresponding one of the pairs of switching elements, and a plurality of (n+1) second resistor elements R1 to R4 are connected in the form of a ladder. If the resistance value of each of the second resistor elements R1 to R4 that are connected in series is represented by R, the resistance value of each of the first resistor elements. R5 to R7 is set to 2R.

Reference symbol R8 denotes a third resistor element connected between one terminal of the second resistor element group (R1 to R4) of the ladder resistor network 15 and the Vss node.

Reference numeral 16 denotes a reference voltage generating circuit for applying an equivalent potential of the reference potential Vref to the second node N2. This circuit is of a low impedance.

As the first voltage setting circuit 11, a current addition type D/A conversion circuit formed by connecting the ladder resistor network 15 to the switching network 14 is used.

Referring to FIG. 2, reference numeral 17 denotes a CP control circuit for controlling the boosting operation of the charge pump circuit 70.

The operation of the internal voltage generating circuit in FIG. 2 will be described next.

Assume that the resistance values of the first and second switch elements M1 to Mn and M1' to Mn' are sufficiently smaller than those of the first resistor elements R5 to R7.

The operation will be outlined first. When the resistance value of the current addition type D/A conversion circuit changes in accordance with the value of a digital input, an output voltage VXX from the output node 10 of the charge pump circuit 70 changes.

In this case, when the circuit in FIG. 2 is in a stable state, the first and second nodes N1 and N2 are virtually short-circuited and set at the reference potential Vref. When the switching network 14 is switched/controlled in accordance with the respective bit signals B1 to Bn and $\overline{B1}$ to $\overline{Bn}$ as the digital inputs, since the potential remains unchanged regardless of whether the first or second node N1 or N2 is selected, a synthetic resistance can be calculated to be described below.

The resistances between the second node N2 and a node C of the resistor connection nodes of the resistor string in the ladder resistor network 15, a synthetic resistance RC1 via a node D is given by R1+R2, i.e., 2R. This resistance value is equal to the resistance value appearing when the resistor element R5 side is seen from the node C, i.e., is equal to 2R.

A current I1 flowing from the node D side into the node C is equal to the current I1 flowing from the first node N1 into the node C through the switch element M1 and the first resistor element R5 when the switch element M1 is on, or the current I1 flowing from the second node N2 into the node C through the switch element M1' and the first resistor element R5 when the switch element M1' is on.

Consider next a node B located adjacent to the node C of the resistor string and closer to the ground potential Vss than the node C. Of the resistances between the node B and the node N2, a synthetic resistance RB1 via the node C is given by R3+1/{(1/R5)+(1/RC1)}, i.e., 2R. This resistance value is equal to the resistance value appearing when the first resistor element R6 side is seen from the node B, i.e., is equal to 2R.

A current I2 (=2×I1) flowing from the node C side into the node B is therefore equal to the current I2 flowing from the first node N1 into the node B through the switch element M2 and the first resistor element R6 when the switch element M2 is on, or the current I2 flowing the second node N2 into the node B through the switch element M2' and the first resistor element R6 when the switch element M2' is on.

As described above, considering the respective resistor connection nodes of the resistor string in the order in which they are arranged toward the ground potential Vss side, a synthetic resistance value RA1 via the node B, of the resistances between the node A and node N2, is equal to the resistance value appearing when the first resistor element R7 side is seen from the node A. Therefore, the synthetic resistances between the node A and the first node N1 and between the node A and the second node N2 are equal to R.

The currents flowing through the respective resistor connection nodes toward the ground potential Vss side are equal to the sums of equal currents flowing from the first resistor elements R5 to R7 and the second resistor elements R1 to R4, and exhibit the following characteristics.

Letting I10' be the current flowing from the ladder resistor network 15 to the ground potential Vss side through the third resistor element R8, the currents flowing through the respective switch elements corresponding to the respective connection nodes from the node A at one terminal of the resistor string, located on the ground potential Vss, to the node D side respectively have weights of I10'/2, I10'/4, and I10'/8. The current I10 as the sum of these currents is converted into a voltage by the load resistor element RL.

Note that when the respective resistor elements are set to a high resistance value as a whole, and a through current in the voltage setting circuit shown in FIGS. 1 and 2 is reduced, the step-up potential rise characteristics are improved, and the power consumption decreases.

In contrast to this, if the respective resistor elements are set to a small resistance value as whole, the response characteristics with respect to a change in the potential at the first node N1 are improved, although the through current slightly increases. This improves the stability at set potentials. Therefore, resistance values must be set in accordance with the application purpose of output voltages.

Referring to FIG. 2, a current I20 flowing into the second voltage setting circuit 12 is represented by $$I20 = Vref/R20 \quad (3)$$

where Vref is the reference voltage, and R20 is the equivalent resistor of the second voltage setting circuit 12.

As described above, since the current flowing from the charge pump circuit 70 through the load resistor element RL is given by I10+I20, the output voltage VXX from the charge pump circuit 70 is represented by $$VXX = Vref + RL \times (I10 + I20) \quad (4)$$

$$= Vref + Vref \cdot RL/R20 + Vref \cdot RL/(R+R8) \sum_{i=1}^{n} 2^{-i} \cdot Bi$$

In equation (4), the first and second terms represent voltages determined by R20, RL, and Vref regardless of the values of digital inputs, B1, B2, . . . Bn (Bn is 0 or 1). The third term represents a voltage proportional to the voltage step width determined by the values of digital inputs according to Vref·RL/(R+R8).

This indicates that the first voltage setting circuit 11 determines the voltage step width of output voltages VXX from the charge pump circuit 70, and the second voltage setting circuit 12 determines the minimum output voltage VXX from the charge pump circuit 70.

Figure 3:
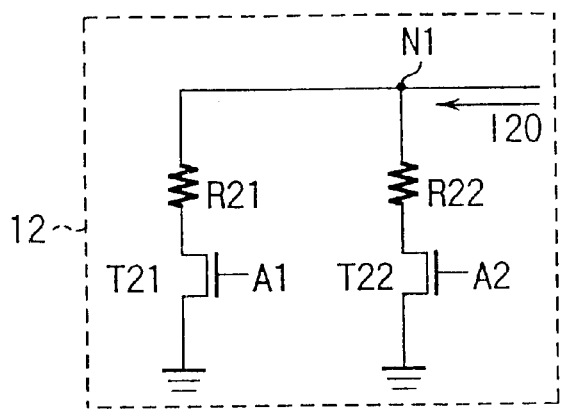
FIG. 3 is a circuit diagram showing an example of the second voltage setting circuit in FIG. 2.

FIG. 3 shows an example of a means for changing the resistance value of the equivalent resistor R20 of the second voltage setting circuit 12.

Referring to FIG. 3, first and second series circuits are connected in parallel between the first node N1 and the ground node. The first series circuit has a resistor element R21 connected in series with a switch element including an NMOS transistor T21 having a gate to which a control signal A1 is applied. The second series circuit has a resistor element R22 connected in series with an element including an NMOS transistor T22 having a gate to which a control signal A2 is applied.

When R21>R22, the control signal A2 is set at "L" level to turn off the transistor T22, and the control signal A1 is set at "H" level to turn on the transistor T21, thereby selecting the resistor element R21. In this case, the minimum value of the output potential VXX of the charge pump circuit 70 decreases, trimming or boosting operation can be performed in steps of Vref·RL/(R+R8) using bit signals B1, ..., Bn as digital inputs to the first voltage setting circuit 11 with reference to this potential.

In contrast to this, when the control signal A1 is set at "L" level to turn off the transistor T21 and the control signal A2 is set at "H" level to turn on transistor T22, and the resistor element R22 is selected, the minimum value of the output potential VXX of the charge pump circuit 70 increases, and trimming or boosting operation can be performed in steps of Vref·RL/(R+R8) using the bit signals B1, ..., Bn as the digital inputs to the first voltage setting circuit 11 with reference to this potential.

According to the internal voltage generating circuit of the first embodiment described above, since the first voltage setting circuit 11 having the function of determining a voltage step width is connected in parallel with the second voltage setting circuit 12 having the function of determining the minimum output potential, the respective functions can be independently executed.

This facilitates processing, e.g., setting of values in the design stage and fine adjustment of set voltages in an actual chip by the FIB process or the like.

In the first voltage setting circuit 11 in FIG. 2, the voltage step width is represented by Vref·RL/(R+R8). The voltage step width can be changed by changing only R8, and the output voltage can be stepped up with different voltage step widths on the basis of the same minimum voltage before R8 is changed. In addition, in the second voltage setting circuit 12 in FIG. 2, the set voltages can be shifted without changing the voltage step width by changing R20. By using these characteristics, the signals A1 and A2 can be used as selection signals corresponding to given operation modes in different set voltage ranges as in, for example, the embodiment shown in FIG. 3.

In addition, since a circuit using a D/A converter is used as the first voltage setting circuit 11 having the function of determining a voltage step width, $2^n$ different voltages can be set by using n signals. As a consequence, control signals, switching MOS transistors, and decoder circuits themselves, which are required by the same number as that of set voltages in the conventional decoding scheme, are not required.

More specifically, when the switch elements M1 to Mn of the first voltage setting circuit 11 are controlled in the OFF state (the switch elements M1' to Mn' are set in the ON state), the current I10 flowing from the first node N1 to the first voltage setting circuit 11 becomes zero, the set voltage becomes the minimum value determined by only the current I20 flowing from the first node N1 to the second voltage setting circuit 12.

In contrast to this, when the switch elements M1 to Mn of the first voltage setting circuit 11 are controlled in the ON state (the switch elements M1' to Mn' are set in the OFF state), the current I10 flowing from the first node N1 to the first voltage setting circuit 11 becomes the maximum value, and hence the set voltage becomes the maximum value.

Referring to the write operation of a NAND-type flash memory, when the data write is failed in verify mode, the voltage applied in the next write operation is set higher than the voltage applied in the previous write operation by a predetermined voltage step width. In the case of a write process for boosting the write voltage by degrees upon rewrite operation for a cell having poor write characteristics, the circuit of the embodiment can easily achieve the write process only by incrementing the digital data comprised of B1, B2, ... Bn supplied to the first voltage setting circuit by use of a counter circuit.

In addition, the circuit of the embodiment can easily make it feasible that the output voltage is stepped up with a twice width by fixing the level of the least significant bit of the digital signal and incrementing a bit next to the least significant bit.

Note that the advantage of the internal voltage generating circuit in FIG. 2 is that the first voltage setting circuit 11 and the second voltage setting circuit 12 are used in combination. If only the first voltage setting circuit 11 is to be used, redundant circuits are required.

Assume that trimming is performed on the range from 15V to 18V in steps of 0.5V. In this case, the digital signal required for trimming from 0V to 18V in steps of 0.5V has to be a six-bit signal.

In practice, since trimming is performed in seven steps, three bits are sufficient for control. When, therefore, only the first voltage setting circuit 11 is to be used, an extra circuit corresponding to redundant bits is required. In this case, when the minimum voltage is set to 15V, not all the bits B1, B2, ... Bn of the digital signal are 0, in other words, the digital signal representing the minimum voltage is a certain combination of "0" and "1". This arrangement makes it difficult to comprehend by intuition the correspondence between each control signal and each set voltage. In addition, since the minimum set voltage and a voltage step width cannot be independently determined, the same problem as that in the prior art is posed.

In contrast to this, with the arrangement shown in FIG. 2, it is only required that the first voltage setting circuit 11 be controlled by a 3-bit control signal. In addition, when all the bits are 0, the signal corresponds to the minimum set voltage, i.e., 15V, the correspondence between each control signal and each set voltage is easy to comprehend.

The relationship described above can be summarized and expressed in Table 1 below. With respect to given set state (A), set state (B) indicates that the minimum set voltage is changed to V2 by changing only the equivalent resistor R20 of the second voltage setting circuit 12. In addition, set state (C) indicates the voltage step width is changed to ΔV2 by changing only the third resistor element R8. In any case of (A) to (C), all the bits of the digital signal representing the minimum set voltage can be set at "L", and thus the correspondence between set voltage values and the digital signals can easily be comprehended.

| B3 | B2 | B1 | (A) | (B) | (C) |
|---|---|---|---|---|---|
| L | L | L | V1 | V2 | V1 |
| L | L | H | V1 + ΔV1 | V2 + ΔV1 | V1 + ΔV2 |
| L | H | L | V1 + 2 ΔV1 | V2 + 2 ΔV1 | V1 + 2 ΔV2 |
| L | H | H | V1 + 3 ΔV1 | V2 + 3 ΔV1 | V1 + 3 ΔV2 |
| ↓ | ↓ | ↓ | ↓ | ↓ | ↓ |
| H | H | H | V1 + 7 ΔV1 | V2 + 7 ΔV1 | V1 + 7 ΔV2 |

(A): The minimum set voltage is set to V1, and the voltage step width is set to ΔV1.
(B): The minimum value is set to V2 by changing only the equivalent resistor R20.
(C): The voltage step width is set to ΔV2 by changing only the resistance element R8.

The above internal voltage generating circuit has a variety of applications. For example, this circuit can be applied to a multi-level high power generating circuit for an electrically programmable nonvolatile semiconductor memory (EEPROM) and word line driving power supplies, dummy word line driving power supplies, internal power supplies, and memory cell data sensing reference potential generating circuits in other types of semiconductor memories.

A case wherein the internal voltage generating circuit of the present invention is applied to the voltage limiter circuit of a high voltage generating circuit (charge pump circuit) for applying a high voltage to a word line (control gate) to write/erase data in/from a NAND EEPROM, and multi-level high voltages are generated in steps of a desired level will be described below.

Figure 4:
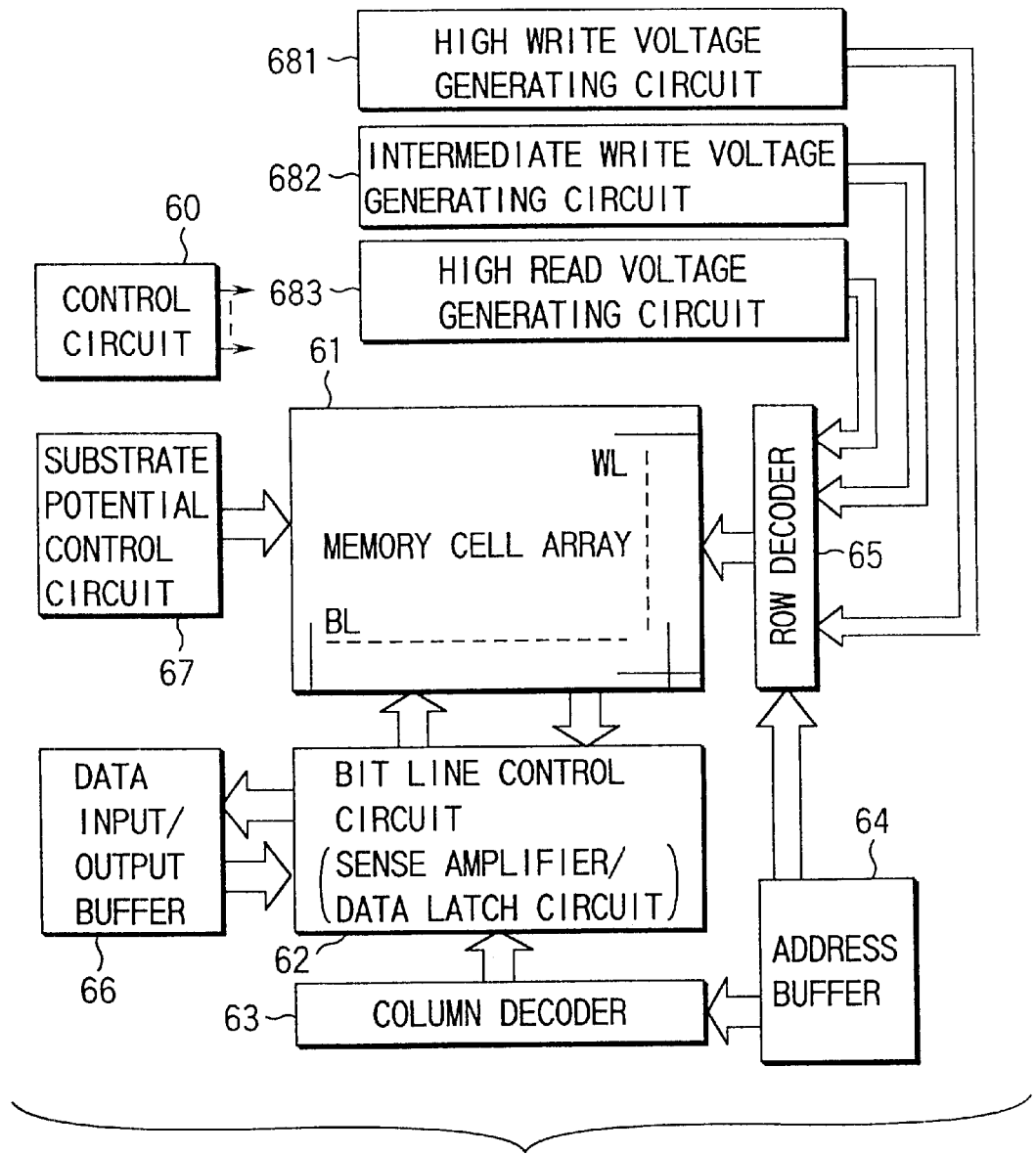
FIG. 4 is a block diagram schematically showing the overall arrangement of a NAND cell type EEPROM to which the present invention is applied.

FIG. 4 is a block diagram schematically showing the overall arrangement of a NAND cell type EEPROM to which the present invention is applied.

Referring to FIG. 4, in a memory cell array 61, NAND cell units, each having series-connected memory cells each having selection gate transistors connected to its two terminals, are arranged in the form of a matrix as a whole.

In the memory cell array 61, each of a plurality of word lines WL is commonly connected to the control gates of the respective cell transistors on the same row, the selection gate transistor connected to the drain of each NAND cell on one end side is connected to a corresponding bit line BL, and the selection gate transistor connected to the source of each NAND cell on the other end side is connected to a common source line.

A bit line control circuit 62 is comprised of a column selection switch for selecting columns of the memory cell array 61, a sense amplifier/write data latch circuit for performing write data latch operation with respect to the memory cell array 61, sense operation for a read of a bit line potential, sense operation for a verify read after a write, and sense operation for rewrite data, a bit line driver for applying a predetermined voltage to each bit line, and the like. The bit line control circuit 62 is connected to a data input/output buffer 66.

A column decoder 63 decodes a column address signal from an address buffer 64 and controls the column selection switch in accordance with the decoded output.

A row decoder 65 is comprised of a decoder circuit for decoding a row address signal from the address buffer 64 and a word line driver for applying predetermined voltages to the word line WL and the selection gate line in accordance with the decoded output from the decoder circuit.

The word line driver of the row decoder 65 receives a high write voltage, an intermediate write voltage, and a high read voltage from a high voltage generating circuit (to be described later), in addition to a power supply potential Vcc and a ground potential (0V). The bit line driver of the bit line control circuit 62 receives the power supply potential Vcc, a ground potential (0V), and the like.

A substrate potential control circuit 67 is arranged to control the potential of a p-type substrate (or p-well) on which the memory cell array 61 is formed. Although not illustrated in FIG. 4, in the erase operation, a high voltage for erase is generated, which is applied to the well of memory cell arrays in order to perform channel erase.

Three high voltage generating circuits 68<sub>1</sub> to 68<sub>3</sub> are arranged in the chip to respectively boost the power supply potential Vcc (e.g., 3.3V) to generate a high write voltage (up to 20V) required to write data in a memory cell, an intermediate write voltage (up to 10V), and a high read voltage (up to 4.5V) required to verify/read data after a write.

A control circuit 60 is arranged to control the operation in the chip and interface with external sections. The control circuit 60 includes a sequence control means (e.g., a programmable logic array) for controlling erase/erase verify/write/write verify/read operation with respect to NAND cells.

The high voltage generating circuits 68<sub>1</sub> to 68<sub>3</sub> have almost the same arrangement. Each of these circuits includes a step-up circuit for obtaining a high voltage by stepping up the power supply potential Vcc, an oscillation circuit such as a ring oscillator that oscillates at a predetermined period to supply two- or four-phase clock signals φp and $\overline{\phi p}$ as driving signals to the step-up circuit, a voltage limiter circuit for limiting the high voltage obtained by the step-up circuit to an arbitrary constant value, and the like.

Figure 5A:
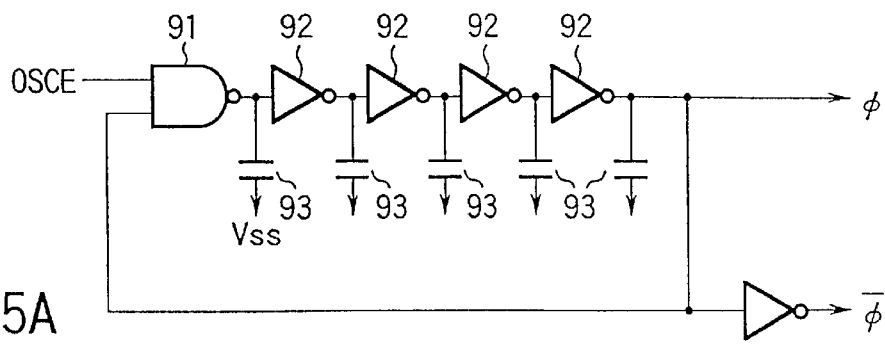
FIG. 5A a circuit diagram showing a ring oscillator as an example of the oscillation circuit used in each high voltage generating circuit in FIG. 4.

FIG. 5A shows a ring oscillator associated with an example of the oscillation circuit used to each of the high voltage generating circuits 68<sub>1</sub> to 68<sub>3</sub> in FIG. 4.

In this ring oscillator, a 2-input NAND circuit 91 to which an oscillation enable signal OSCE and a feedback signal based on the clock signal φ are input and a plurality of inverter circuits 92 are connected in the form of a ring, and capacitors 93 are connected between the respective interstage portions and the Vss nodes. A clock signal φ output from the inverter circuit on the last stage is inverted into a clock signal $\overline{\phi}$ by an inverter circuit.

Figure 5B:
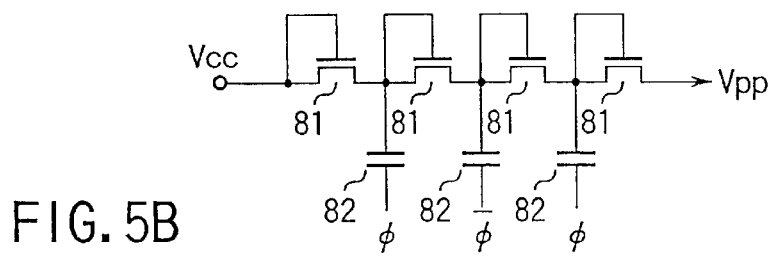
FIG. 5B is a circuit diagram showing a Vpp generating circuit as a representative example of a charge pump circuit used in each high voltage generating circuit.

FIG. 5B shows a Vpp generating circuit as a representative of the charge pump circuits used in the respective high voltage generating circuits 68<sub>1</sub> to 68<sub>3</sub> in FIG. 4.

As is well known, this charge pump circuit arrangement is made up of MOS transistors 81 having sources and gates mutually connected and capacitors 82 each having one terminal connected to the drain of a corresponding one of the MOS transistor and the other terminal to which the clock signal φp or $\overline{\phi}$ from the oscillator circuit is applied. While the two-phase clock signals φp and $\overline{\phi p}$ are alternately activated, a high voltage (Vpp in this case) is generated at the charge pump output node.

Figure 6:
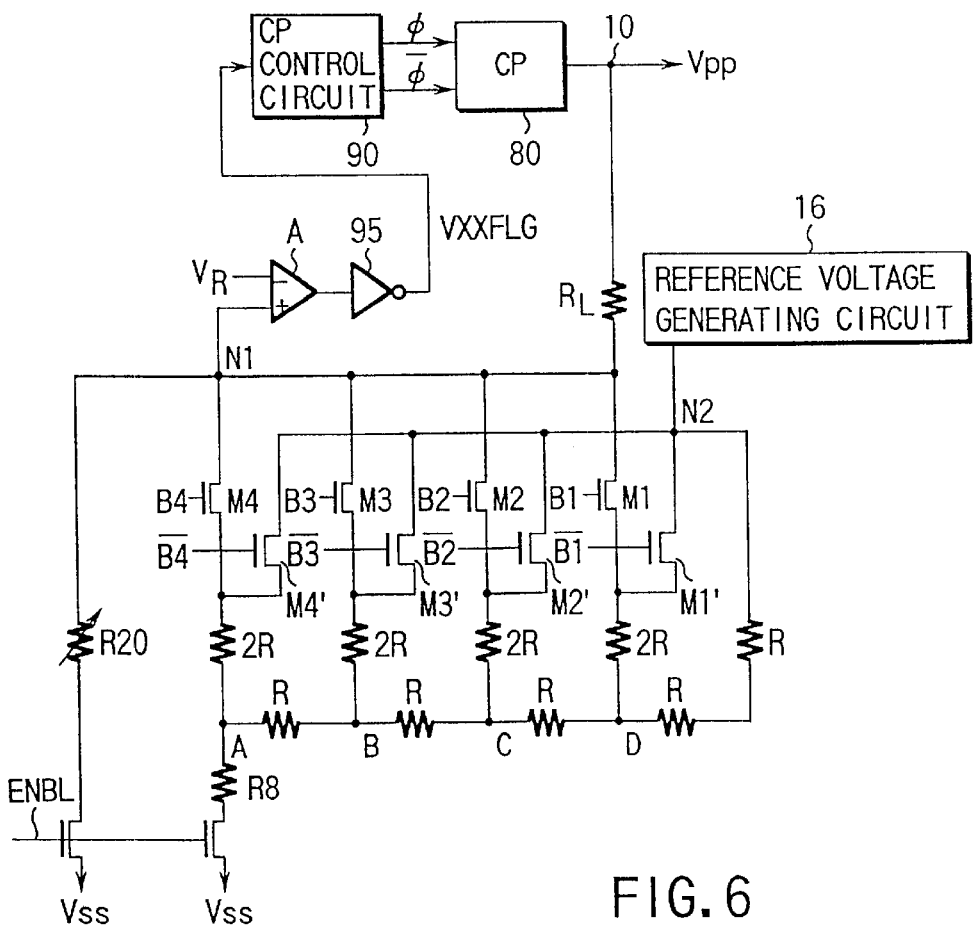
FIG. 6 is a circuit diagram showing a Vpp generating circuit and a Vpp limiter circuit as representative components of each high voltage generating circuit in FIG. 4.

FIG. 6 shows a Vpp generating circuit and a Vpp limiter circuit as representative circuits in each of the high voltage generating circuits 68<sub>1</sub> and 68<sub>2</sub> in FIG. 4.

One terminal of a load resistor element RL is connected to an output node 10 of the charge pump circuit 80, and the signal VXXFLG obtained by inverting an output from an operational amplifier A through an inverter circuit 95 is supplied as an oscillation enable signal to a CP control circuit 90. In the write mode, the charge pump circuit 80 is activated when an enable signal ENBL is set at "H" level.

As a resistor network of a D/A conversion circuit, a combination of four pairs of switch elements (M1, M1') to (M4, M4') corresponding to complementary 4-bit digital signals (B1, $\overline{B1}$) to (B4, $\overline{B4}$) and an R–2R ladder resistor circuit is used.

When the output voltage from the charge pump circuit 80 drops for some reason, the potential of node N1 is dropped in proportion to the drop of the Vpp. As a result, the output from the operational amplifier A is set at "L" level, and the output from the inverter circuit 95 (oscillation enable signal OSCE) is set at "H" level. The CP control circuit 90 oscillates at the period determined by the characteristics of the circuit, and the two-phase clock signals φp and $\overline{\phi p}$ are alternately activated. As a result, the charge pump circuit 80 operates, and its output voltage Vpp rises.

When the output voltage from charge pump circuit 80 excessively rises, the potential of node N1 rises in proportional of the rise of Vpp. As a consequence, the output from the operational amplifier is set at "H" level, and the output from the inverter circuit 95 is set at "L" level. As a result, the CP control circuit 90 stops operating, and the charge pump circuit 80 stops its boosting operation. With this operation, the voltage at the output node of the charge pump circuit 80 gradually drops owing to the current flowing from the output node of the charge pump circuit 80 to the Vpp limiter circuit.

By repeating the above feedback operation, the output voltage is stabilized to Vpp.

Figure 8:
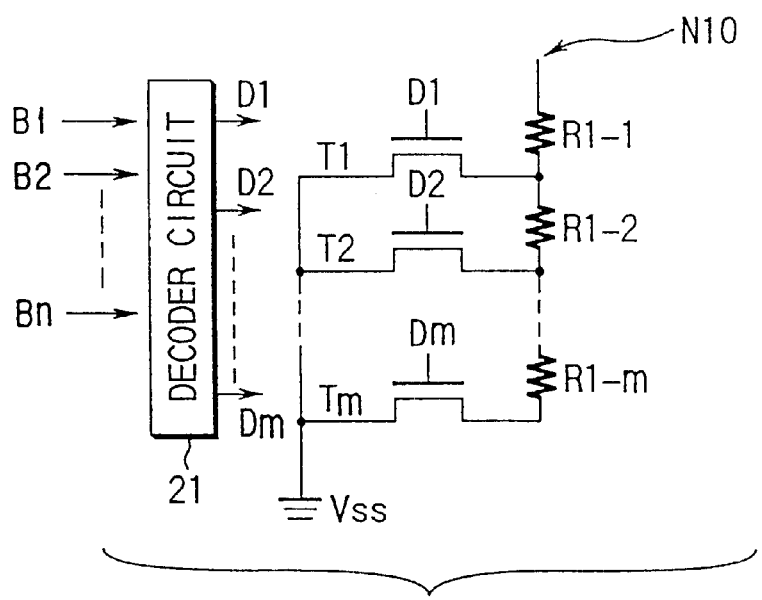
FIG. 8 is a circuit diagram showing a voltage trimming circuit of a resistance-type potential dividing scheme in FIG. 7.
Figure 9A:
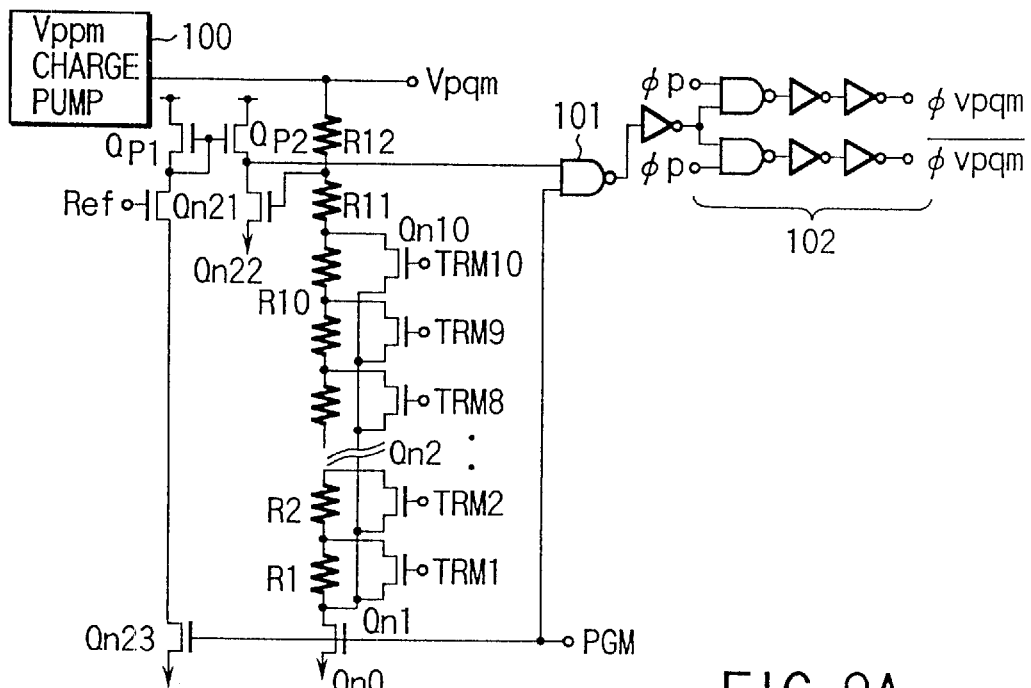
FIG. 9A is a circuit diagram showing examples of a write voltage (Vpgm) generating circuit and a voltage limiter circuit used in a conventional NAND cell type flash memory.
Figure 9B:
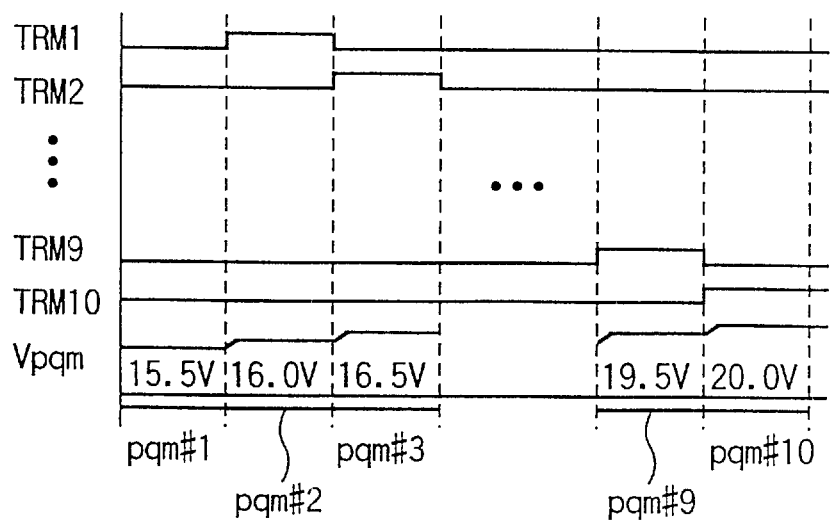
FIG. 9B is a timing chart exemplarily showing the operation of the circuits in FIG. 9A.

In this case, the resistor elements used in the four-stage R–2R ladder resistor circuit are five Rs and four 2Rs, and the number of resistor elements used in the overall Vpp limiter circuit is 12, including RL, R8, and R20. That is, the number of resistor elements can be decreased, in comparison with such a conventional circuitry as illustrated in FIG. 8.

In addition, the amount of current flowing through the resistance-type potential divider can be arbitrarily changed by changing the values of RL, R8, and R20, without changing Vpp, while the resistance ratios RL/(R+R8) and RL/R20 are kept constant. In other words, even if the values of resistor elements vary for some reason, a desired current amount can be determined by adjusting only the three elements RL, R8, and R20. This facilitates design of a Vpp generating circuit, and can reduce the pattern area.

Note that the internal voltage generating circuit of the present invention can be applied to various types of power supply potential generating circuits as well as the high voltage generating circuit (step-up circuit) described above. The present invention is effective especially when the number of steps to change is large.

In addition, both the internal voltage generating circuit of the present invention and the conventional internal voltage generating circuit may be arranged in the system. That is, the circuit of the present invention may be used for a portion where fine settings are required near a predetermined potential, whereas the conventional circuit may be used for a portion where fine potential settings are not required much.

As has been described above, according to the present invention, a current addition type D/A conversion circuit as the first voltage setting circuit is connected in parallel with another type of resistance circuit as the second voltage setting circuit to constitute a limiter circuit. This arrangement makes it relatively easy to output multi-level voltages between a reference potential and a power supply potential higher than the reference potential.

This scheme of the present invention requires no decoder circuits and allows a decrease in the number of resistor elements as compared with the conventional scheme using decoding for trimming. In addition, in comparison with the scheme using only D/A conversion circuits, the number of bits of a digital input can be minimized, and an increase in the proportion of the pattern area of the trimming circuit can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An internal voltage generating circuit comprising:
a voltage generating circuit;
a load resistor element having one terminal connected to an output node of the voltage generating circuit;
a first voltage setting circuit including a digital/analog conversion circuitry and a reference voltage generating circuit provided in said first voltage setting circuit for generating a reference voltage supplied to said digital/analog conversion circuitry, said digital/analog conversion circuitry having a first equivalent resistor connected between a ground and a first node coupled to the other terminal of the load resistor element, for controlling the magnitude of an input current flowing through the first equivalent resistor from the load resistor element by controlling the equivalent resistor having a resistance value determined in accordance with digital input data so as to set a potential at the output node of the voltage generating circuit having a potential varying step determined with bit contents of the digital input data;
a second voltage setting circuit including a second equivalent variable resistor connected between the ground and the first node coupled to the other terminal of the load resistor element for allowing a current to flow through the second equivalent resistor from said load resistor element so as to determine the minimum voltage output of the voltage generating circuit;
a potential comparison circuit for comparing a potential at the first node with a predetermined reference potential, and outputting a comparison result; and
a voltage control circuit for setting the potential at the first node equal to the reference potential by substantially controlling the voltage generating circuit in accordance with the comparison result, during a voltage generating operation in which both of said first and second voltage setting circuits are activated.

2. The circuit according to claim 1, wherein:
said first voltage setting circuit sets the output node of said voltage generating circuit at one of first multiple voltages by controlling the resistance value of said first equivalent resistor in accordance with the digital input data, and
said second voltage setting circuit sets the output node of said voltage generating circuit at one of second multiple voltages by controlling a resistance value of the second equivalent resistor.

3. The circuit according to claim 1, wherein:
said first voltage setting circuit and said second voltage setting circuit set voltages, respectively, at the output node of said voltage generating circuit independent of each other, and
said second voltage setting circuit sets a minimum value of the voltages at the output node of said voltage generating circuit.

4. A semiconductor integrated circuit including an internal voltage generating circuit, the internal voltage generating circuit comprising:
a voltage generating circuit;
a load resistor element having one terminal connected to an output node of the voltage generating circuit;
a first voltage setting circuit including a digital/analog conversion circuitry and a reference voltage generating circuit provided in said first voltage setting circuit for generating a reference voltage supplied to said digital/analog conversion circuitry said digital/analog conversion circuitry having a first equivalent resistor connected between a ground and a first node coupled to the other terminal of the load resistor element, for controlling a magnitude of an input current flowing through the first equivalent resistor from the load resistor element by controlling the first equivalent resistor to have a resistance value determined by digital input data so as to set a potential at the output node of said voltage generating circuit having a potential varying step determined with bit contents of the digital input data;

a second voltage setting circuit including a second equivalent variable resistor connected between the ground and the first node coupled to the other terminal of the load resistor element, for allowing a current to flow through the second equivalent resistor from said load resistor element so as to determine the minimum voltage output of the voltage generating circuit;

a potential comparison circuit for comparing a potential at the first node with a reference potential and outputting a comparison result; and a voltage control circuit for setting a potential at the first node equal to the reference potential by substantially controlling the voltage generating circuit in accordance with the comparison result, during a voltage generating operation in which both of said first and second voltage setting circuits are activated:

wherein said digital/analog conversion circuitry comprises:

a plurality of first switch elements each having one terminal commonly connected to said first node, and each being switched in accordance with a corresponding bit of said digital input data;

a plurality of second switch elements each having one terminal commonly connected to a second node to which a reference voltage having a potential substantially equal to said reference potential supplied from said reference voltage generating circuit is applied, each having the other terminal connected to the other terminal of a corresponding one of said plurality of first switch elements, and each being switched in accordance with a complementary bit signal of a corresponding bit signal of said digital input data;

a ladder resistor network comprising;

a plurality of first resistor elements each having a first resistance value; and a plurality of second resistor elements each having a second resistance value, and being connected in series, the second resistance value being substantially one half of the first resistance value, said plurality of first resistor elements and said plurality of second resistor elements being connected in a form of a ladder, said first resistor elements each being connected to a corresponding one of connecting nodes coupled to a corresponding one of said plurality of first switch elements and a corresponding one of said plurality of second switch elements; and a third resistor element being connected between a ground node and one end of said plurality of second resistor elements connected in series.

5. A semiconductor memory device including a data-rewritable nonvolatile semiconductor memory cell, comprising:

an oscillation circuit for generating a clock signal with a predetermined period during oscillation operation, in accordance with an oscillation enable signal;

a charge pump circuit for generating at least one predetermined boosted voltage from a power supply voltage in accordance with the clock signal;

a load resistor element having one terminal connected to an output node of the charge pump circuit;

a first voltage setting circuit including a digital/analog conversion circuitry and a reference voltage generating circuit provided in said first voltage setting circuit for generating a reference voltage supplied to said digital/analog conversion circuitry, said digital/analog conversion circuitry having a first equivalent resistor connected across a ground and a first node coupled to the other terminal of the load resistor element, for controlling a magnitude of an input current flowing the first equivalent resistor from said load resistor element by controlling the equivalent resistor having a resistance value determined in accordance with digital input data so as to set a potential at the first node based on a minimum voltage output of the voltage generating circuit and having a potential varying step determined with bit contents of the digital input data;

a second voltage setting circuit including a second equivalent resistor connected across the ground and the first node, for passing a current flowing the second equivalent resistor from said load resistor element;

an operational amplification circuit for comparing a potential at the first node with a predetermined reference potential, and for supplying the oscillation enable signal to the oscillation circuit in accordance with a comparison result; and a memory cell array comprising a plurality of memory cells, data being written into and being erased from the plurality of memory cells by using the boosted voltage of the charge pump circuit, during a voltage generating operation in which both of said first and second voltage setting circuits are activated.

6. The circuit according to claim 1, wherein:

said first voltage setting circuit delivers an analog voltage output having a value varying between a minimum value and a maximum value determined in accordance with contents of the digital input data at the output node of said voltage generating circuit; and said second voltage setting circuit delivers a potential for setting the minimum value of the first voltage setting circuit at this potential.

7. The circuit according to claim 4, wherein:

said first voltage setting circuit delivers an analog voltage output having a value varying between a minimum value and a maximum value determined in accordance with contents of the digital input data at the output node of said voltage generating circuit; and said second voltage setting circuit delivers a potential for setting the minimum value of the first voltage setting circuit at this potential.

8. The circuit according to claim 4, wherein said potential varying step determined with bit contents of the digital input data is changed by only changing said third resistor, without changing the minimum voltage output of the voltage generating circuit.

9. An internal voltage generating circuit comprising:

a voltage generating circuit;

a load resistor element having one terminal connected to an output node of the voltage generating circuit;

a first circuitry including a digital/analog conversion circuit and a reference voltage generating circuit provided in said first circuitry for generating a reference voltage supplied to said digital/analog conversion circuit, said digital/analog conversion circuit having a first equivalent resistor connected between a ground and a first node coupled to the other terminal of the load resistor element, for controlling the magnitude of an input current flowing through the first equivalent resistor from the load resistor element by controlling the equivalent resistor from the load resistor element by controlling the equivalent resistor having a resistance value determined in accordance with digital input data so as to set a potential at the output node of the voltage generating circuit having a potential varying step determined with hit contents of the digital input data;

a second circuitry including a second equivalent variable resistor connected between the ground and the first node coupled to the other terminal of the load resistor element, for allowing a current to flow through the second equivalent resistor from said load resistor element so as to shift a potential at the output node of the voltage generating circuit;

a potential comparison circuit for comparing a potential at the first node with a predetermined reference potential, and outputting a comparison result; and a voltage control circuit for setting the potential at the first node equal to the reference potential by substantially controlling the voltage generating circuit in accordance with the comparison result.

10. The semiconductor memory device according to claim 5, wherein said second equivalent resistor is a variable resistor.

* * * * *